United States Patent
Yamazaki et al.

(10) Patent No.: US 7,569,914 B2
(45) Date of Patent: Aug. 4, 2009

(54) SEMICONDUCTOR DEVICES AND METHOD OF MANUFACTURING THEM

(75) Inventors: Shinya Yamazaki, Okazaki (JP); Tomoyoshi Kushida, Seto (JP); Takahide Sugiyama, Aichi-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 11/902,978

(22) Filed: Sep. 27, 2007

(65) Prior Publication Data

US 2008/0023795 A1    Jan. 31, 2008

Related U.S. Application Data

(62) Division of application No. 11/436,616, filed on May 19, 2006, now Pat. No. 7,507,646.

(30) Foreign Application Priority Data

May 20, 2005    (JP) ............................. 2005-147911
May 18, 2006    (JP) ............................. 2006-138606

(51) Int. Cl.
    *H01L 29/30*    (2006.01)
(52) U.S. Cl. ....................... 257/655; 257/617
(58) Field of Classification Search ............... 438/520; 257/611, 18, 617, 655, 520
    See application file for complete search history.

(56) References Cited

U.S. PATENT DOCUMENTS

| 5,286,660 A | * | 2/1994 | Chiou et al. ................. 438/535 |
| 6,013,566 A | | 1/2000 | Thakur et al. |
| 6,077,734 A | | 6/2000 | Lee |
| 6,096,627 A | | 8/2000 | Harris et al. |
| 6,610,572 B1 | | 8/2003 | Takei |
| 6,759,301 B2 | | 7/2004 | Takei |
| 6,762,097 B2 | | 7/2004 | Takei |
| 7,163,901 B2 | | 1/2007 | Downey |

FOREIGN PATENT DOCUMENTS

JP    7-106605    4/1995

* cited by examiner

*Primary Examiner*—Roy K Potter
(74) *Attorney, Agent, or Firm*—Finnegan, Henderson, Farabow, Garrett & Dunner, LLP

(57) ABSTRACT

With conventional device, the quantity of complex defects differs with each semiconductor device because the concentration of impurities intrinsically contained differs for each silicon wafer. Consequently, there is an undesirable variation in characteristics among the semiconductor devices. The invention provides a method for manufacturing PIN type diode which comprises an intermediate semiconductor region in which complex defects are formed. The method comprises introducing impurities (for example, carbon), which are the same kind of impurities intrinsically contained in the intermediate semiconductor region, into the intermediate semiconductor region, and irradiating the intermediate semiconductor region with helium ions to form point defects.

12 Claims, 8 Drawing Sheets (A)  (B)

(A)  (B)

(A)　　　　　　　　　　(B)

US 7,569,914 B2

SEMICONDUCTOR DEVICES AND METHOD OF MANUFACTURING THEM

CROSS-REFERENCE TO RELATED APPLICATION

This is a division of application Ser. No. 11/436,616, filed May 19, 2006 which is incorporated herein by reference.

The present application claims priority based on Japanese Patent Application 2005-147911 filed on May 20, 2005 and Japanese Patent Application 2006-138606 filed on May 18, 2006 the contents of which are hereby incorporated by reference within this application.

BACKGROUND OF THE INVENTION

Field of the Invention

The present invention relates to a semiconductor device comprising a semiconductor region having complex defects. Further, the present invention relates to a method of manufacturing the semiconductor device comprising the semiconductor region having complex defects.

In order to improve characteristics (typically the switching characteristics) of a semiconductor device, complex defects are formed in a semiconductor region of the semiconductor device. The complex defect is a defect where a point defect in the semiconductor region and an impurity atom are combined. The term impurity or impurities in this specification do not refer to conductive impurities or doses that are intentionally introduced to the semiconductor region to determine conductivity of the semiconductor region, but refer to non-conductive impurities intrinsically contained in the semiconductor region. For example, elements of non-conductive impurities include oxygen, carbon, nitrogen, etc. Further, the term point defect refers to a local disturbance of a crystal lattice forming the semiconductor region. The point defect includes a vacancy type and an interstitial atom type. Complex defect in which the point defect and the impurity are combined is known to exist stably within the semiconductor region.

Complex defects form a deep energy level, and, for this reason, complex defects can provide locations where positive holes and electrons recombine. Therefore, by forming complex defects in the semiconductor region, it becomes possible to control the lifetime of carriers. As a result, the semiconductor device can be formed with less loss of energy, less recovery surge voltage, etc. This type of semiconductor device is taught in Japanese Patent Application Publication No. 1995-106605.

A method of forming complex defects in PIN type diode 200 will be described with reference to FIG. 11. PIN type diode 200 comprises n$^+$ type cathode semiconductor region 222, n$^-$ type (or i type) intermediate semiconductor region 224, and p$^+$ type anode semiconductor region 226. PIN type diode 200 is made of silicon wafers. Cathode semiconductor region 222 is formed by introducing n type impurities into a bottom surface of an n$^-$ type silicon wafer. Anode semiconductor region 226 is formed by introducing p type impurities into a top surface of the n$^-$ type silicon wafer. An anode electrode 232 is connected to anode semiconductor region 226. The configuration shown in FIG. 11 is a condition prior to a cathode electrode being formed.

Electron beam irradiation is usually used to form complex defects. As shown in FIG. 11, in the case where complex defects are formed in intermediate semiconductor region 224, the electron beams are irradiated from cathode semiconductor region 222 side towards a predetermined depth of intermediate semiconductor region 224. Point defects 244 are formed in intermediate semiconductor region 224 which has been irradiated by the electron beams. Complex defects are formed by combining point defects 244 with the impurities that intrinsically exist in the vicinity of point defects 244 thus formed.

SUMMARY OF THE INVENTION

As described above, when manufacturing PIN type diode 200, silicon wafers are usually used. The concentration of the impurities intrinsically contained in silicon wafers often differs greatly with each silicon wafer. Generally, silicon wafers are obtained by slicing a wafer off an ingot. In most cases, the concentration of impurities contained in a silicon wafer obtained by slicing off an upper part of an ingot differs greatly from the concentration of impurities contained in a silicon wafer obtained by slicing off a lower part of the ingot. As described above, complex defects are formed by combining point defects with impurities. As a result, the quantity of complex defects formed is determined based on which contributes a lower quantity to the combining process: the quantity of impurities intrinsically contained in the semiconductor region, or the quantity of point defects formed from irradiation of electron beams.

FIG. 12 shows the distribution of impurity concentration along the depth direction of the intermediate semiconductor region 224. The impurity concentration of intermediate semiconductor region 224 obtained from separate silicon wafers is shown by 212a and 214a in the figure. As shown in FIG. 12, the impurity concentration that is intrinsically contained differs for each of the silicon wafers. The quantity of point defects 244 that are formed by electron beam irradiation can be adjusted by adjusting the output of the electron beam irradiation. If the quantity of point defects 244 is adjusted to be lower than a lower impurity concentration (212a in the figure), the quantity of complex defects formed in a intermediate semiconductor region containing the lower impurity concentration (212a in the figure) and the quantity of a intermediate semiconductor region containing the higher impurity concentration (214a in the figure) become approximately equal. However, if the quantity of point defects 244 is adjusted to be higher than the lower impurity concentration (212a in the figure), the quantity of complex defects formed in the semiconductor region containing the lower impurity concentration (212a) will be lower than the quantity of complex defects formed in the semiconductor region containing the higher impurity concentration (214a).

In general, the impurity concentration of the silicon wafer is not measured during the process of forming the complex defects. Instead, point defects 244 are formed so as to have a larger concentration than the higher impurity concentration (214a) intrinsically contained in the silicon wafer.

In this case, as shown in FIG. 13, when a sufficient quantity of point defects 244 is formed, the quantity of complex defects formed within the semiconductor region will be determined by impurity concentration 212a or 214a intrinsically contained in the silicon wafers. Therefore, when impurity concentrations 212a and 214a intrinsically contained in the silicon wafers differ, the quantity of complex defects formed in the silicon wafers also differ. As a result, the characteristics of the semiconductor devices obtained from differing silicon wafers vary depending on the silicon wafer from which the semiconductor device is formed.

The present invention was created to solve the aforementioned problem. In the above example, PIN type diode 200 was used to explain the problem. However, the same type of problem can also occur with other types of semiconductor devices. Further, complex defects are formed in semiconductor devices not only to improve switching characteristics, but also to improve other characteristics such as on-resistance, voltage withstanding characteristics, quantity withstanding characteristics, etc. The techniques taught in the present specification are useful in a variety of purposes for forming complex defects in a semiconductor region of a semiconductor device. Further, in the above example, silicon wafers were used to explain the problem. However, the same problem exists with semiconductor wafers made from other materials because the impurity concentration is different for each wafer. Therefore, the techniques taught in the present specification are also useful in cases where semiconductor wafers other than silicon are utilized.

One object of the present invention is to reduce the variation in quantity of complex defects formed in semiconductor regions.

Another object of the present invention is to reduce the variation in characteristics of the semiconductor devices.

Another object of the present invention is to present a method for manufacturing the above semiconductor devices.

Another object of the present invention is to present a semiconductor device comprising a semiconductor region that has been adjusted to have a desired quantity of complex defects.

The present invention is characterized in that the impurity concentration within a semiconductor region, which is originally different for each semiconductor wafer, is uniformized by means of the process disclosed below. Usually, the impurity concentration intrinsically contained within the semiconductor region is extremely low. As a result, even a slight difference in the impurity concentration among the semiconductor wafers can be considered significant because the overall concentration of the impurities is low. However, the difference in the impurity concentration among the semiconductor wafers becomes negligible when the overall concentration of the impurities becomes high. The present invention was created with this point in mind. In the present invention, variations in impurity concentration among differing wafers are made negligible by introducing a large quantity of impurities of the same kind as the impurities intrinsically contained within the semiconductor region. By utilizing the present invention, the variation of impurity concentrations among differing wafers becomes negligible.

The present invention teaches a method of manufacturing a semiconductor device comprising a semiconductor region having complex defects. The method comprises a step of introducing impurities into the semiconductor region. The introducing impurities are of the same kind as impurities intrinsically contained within the semiconductor region. The method further comprises a step of forming point defects in the semiconductor region. The sequence of the above steps is not significant. Depending on the situation, the above steps can be implemented simultaneously.

In order to better understand the techniques of the present invention, an outline of the techniques will be described metaphorically, though this is not very precise. The concentration of impurities intrinsically contained in the semiconductor region of semiconductor wafer "A" shall be 1.0, and the concentration of impurities contained in the semiconductor region of semiconductor wafer "B" shall be 2.0. In this case, the difference between the concentrations of impurities intrinsically contained in the two semiconductor regions is such that the concentration of one is twice the concentration of the other. If 100.0 impurities of the same kind as the impurities intrinsically contained in the semiconductor regions are introduced into both semiconductor regions, the impurity concentration of the semiconductor region of the semiconductor wafer "A" becomes 101.0, and the impurity concentration of the semiconductor region of the semiconductor wafer "B" becomes 102.0. By introducing a large quantity of impurities, the variation in the impurity concentrations of the two semiconductor regions becomes relatively small. It is consequently possible, by adjusting the quantity of point defects that is formed, to reduce the variation in the quantity of complex defects formed in the two semiconductor regions. Further, in a case where more complex defects than required have been formed by introducing a large quantity of impurities, a process may be performed to remove the complex defects. This process may be performed after the large quantity of complex defects has been formed. It is possible to adjust the quantity of complex defects to the required quantity while reducing the variation in the quantity of complex defects formed among the semiconductor regions.

In the method according to the present invention, it is preferred that the semiconductor region is exposed to a light ion beam and/or an electron beam in order to form point defects.

If a light ion beam and/or an electron beam is utilized, it becomes easier to form the point defects in local regions of the semiconductor region.

In the method according to the present invention, it is preferred that a region where the largest quantity of the impurities is introduced and a region where the largest quantity of the point defects is formed are located at approximately the same depth in the semiconductor region.

If the above method is utilized, complex defects can be formed at local regions of the semiconductor region. With the above method, the characteristics of the semiconductor device can be markedly improved.

In the method according to the present invention, it is preferred that the highest concentration of the impurities introduced into the semiconductor region is greater than the concentration of the impurities intrinsically contained within the semiconductor region.

If the above method is utilized, the quantity of impurities intrinsically contained within local regions of the semiconductor region will be increased twice as much, or more, by means of introducing impurities. When the quantity of impurities is increased twice as much or more as the quantity of impurities intrinsically contained, the variation of the impurity concentrations of the semiconductor devices becomes negligible.

In the method according to the present invention, the step of introducing impurities may be performed prior to the step of forming point defects. In other words, the step of introducing impurities and the step of forming point defects are separate steps, and the former may be performed before the latter.

In the method according to the present invention, the method may further comprise heating the semiconductor region to more than 800 degrees Celsius between the step of introducing impurities and the step of forming point defects.

By heating the semiconductor region to more than 800 degrees Celsius after the step of introducing impurities, the damage incurred by the semiconductor region when the impurities were introduced can be recovered. Further, by heating the semiconductor region to more than 800 degrees Celsius after the step of introducing impurities, the introduced impurities can be displaced in the lattice location of the semiconductor region. By utilizing the aforementioned method, impurities can be introduced into the semiconductor region in large quantities.

In the method according to the present invention, it is preferred that the method further comprise heating the semiconductor region to between 200 degrees Celsius and 600 degrees Celsius after the step of forming point defects.

The combining of the impurities and the point defects can be accelerated by heating the semiconductor region to between 200 degrees Celsius and 600 degrees Celsius. Further, the quantity of complex defects falls if the semiconductor region is heated to more than 600 degrees Celsius. However, as stated above, it may be desirable to reduce the quantity of complex defects when required. In this case, the complex defects may first be formed by heating the semiconductor region to between 200 degrees Celsius and 600 degrees Celsius, and then the semiconductor region may be heated to more than 600 degrees Celsius to reduce the quantity of complex defects.

In the method according to the present inventions it is preferred that the impurities being non-conductive type are introduced into the semiconductor region. Non-conductive type impurities are different from impurities or doses that function as acceptors or donors within the semiconductor region. Further, the kind of non-conductive type impurities differs depending on the material of the semiconductor region.

In the method according to the present invention, silicon may be used as the semiconductor material of the semiconductor region. In this case, impurities selected from at least one of carbon, oxygen, nitrogen, fluorine, argon, silicon, or germanium are introduced into the semiconductor region.

In the method of the present invention, the aforementioned elements may be utilized in combination. Further, by selecting the appropriate elements to use, the required types of complex defects can be formed accordingly.

In the case where the semiconductor material is silicon, carbon and oxygen, for example, are used for forming complex defects that trap positive holes. Oxygen and nitrogen are used for forming complex defects that trap electrons. In this way, the required types of complex defects can be formed by selecting the appropriate elements from the aforementioned elements.

A semiconductor device according to the present invention comprises a semiconductor region having complex defects. With the semiconductor device according to the present invention, the impurities contained in the semiconductor region have an uneven concentration distribution along a depth direction of the semiconductor region.

The uneven concentration distribution along the depth direction of the semiconductor region indicates that impurities have been introduced intentionally into the semiconductor region. If semiconductor devices have the above characteristic, it is clear that those semiconductor devices utilize the technical concepts of the present invention.

In the semiconductor device according to the present invention, it is preferred that the impurities being the non-conductive type have an uneven concentration distribution along the depth direction of the semiconductor region.

In the semiconductor device according to the present invention, it is preferred that the impurities have a maximum concentration of greater than or equal to twice the minimum concentration along the depth direction of the semiconductor region.

The minimum concentration is approximately equal to the concentration of impurities that is intrinsically contained in the semiconductor region. That the impurities are distributed in such a way indicates that impurities have been introduced intentionally into the semiconductor region, giving the semiconductor region a higher concentration of impurities than the concentration of impurities intrinsically contained therein. If semiconductor devices have the above characteristic, it is clear that those semiconductor devices utilize the technical concepts of the present invention.

The present invention can be realized in a diode semiconductor device. The semiconductor of the present invention comprises an anode semiconductor region that includes impurities of a first conductivity, a cathode semiconductor region that includes a high concentration of impurities of a second conductivity type, and an intermediate semiconductor region that includes a low concentration of impurities of the second conductivity type or includes substantially no impurities. Further, the intermediate semiconductor region is formed between the anode semiconductor region and the cathode semiconductor region. With the semiconductor device of the present invention, non-conductive impurities have an uneven concentration distribution along the direction that joins the anode semiconductor region and the cathode semiconductor region.

That the non-conductive impurities are distributed unevenly indicates that the non-conductive impurities have been introduced intentionally into the semiconductor device. It is clear that the technical concepts of the present invention are utilized with semiconductor devices having the above characteristic.

With respect to the diode semiconductor device, the anode semiconductor region may shares a boundary with the intermediate semiconductor region. In this case, it is preferred that the position of the maximum concentration of the non-conductive impurities is located in the vicinity of the boundary between the anode semiconductor region and the intermediate semiconductor region.

The reverse-recovery characteristics of the semiconductor device are improved if complex defects are formed locally in the vicinity of the boundary between the anode semiconductor region and the intermediate semiconductor region.

With respect to this diode semiconductor device, it is preferred that the non-conductive impurities have a maximum concentration that is greater than or equal to twice the minimum concentration along the direction that joins the anode semiconductor region and the cathode semiconductor region.

That the non-conductive impurities are distributed in such a way indicates that the non-conductive impurities have been introduced intentionally into the semiconductor device. It is clear that the technical concepts of the present invention are utilized with semiconductor devices having the above characteristic.

The present invention can be realized as an IGBT (Insulated Gate Bipolar Transistor) semiconductor device. Such a semiconductor device of the present invention comprises a collector electrode. The semiconductor device further comprises a collector semiconductor region that includes impurities of a first conductivity type. The collector semiconductor region is formed above the collector electrode. The semiconductor device further comprises a second conductivity type base semiconductor region that includes impurities of the second conductivity type. The second conductivity type base semiconductor region is formed above the collector semiconductor region. The semiconductor device further comprises a first conductivity type base semiconductor region that includes impurities of the first conductivity type. The first conductivity type base semiconductor region is separated from the collector semiconductor region by the second conductivity type base semiconductor region. The semiconductor device further comprises an emitter semiconductor region that includes impurities of the second conductivity type. The matter semiconductor region is separated from the second conductivity type base semiconductor region by the first conductivity type base semiconductor region. The semiconductor device further comprises a gate electrode that faces, via an insulating film, the first conductivity type base semiconductor region that separates the emitter semiconductor region and the second conductivity type base semiconductor region. With respect to the semiconductor device of the present invention, non-conductive impurities have an uneven concentration distribution along the direction that joins the collector semiconductor region and the emitter semiconductor region.

That the non-conductive impurities are distributed unevenly indicates that the non-conductive impurities have been introduced intentionally into the semiconductor device. It is clear that the technical concepts of the present invention are utilized with semiconductor devices having the above characteristic.

The aforementioned IGBT semiconductor device may be configured as a non-punch-through IGBT semiconductor device, where the collector semiconductor region shares a boundary with the second conductivity type base semiconductor region. This non-punch-through IGBT semiconductor device can apply to bulk type IGBT. With respect to this non-punch-through IGBT semiconductor device, it is preferred that the position of maximum concentration of non-conductive impurities is located in the vicinity of the boundary between the collector semiconductor region and the second conductivity type base semiconductor region.

The reverse-recovery characteristics of the semiconductor device are improved if complex defects are formed in the vicinity of the boundary between the collector semiconductor region and the second conductivity type base semiconductor region.

The aforementioned IGBT semiconductor device may further comprise a buffer semiconductor region that includes a higher concentration of impurities of the second conductivity type than the second conductivity type base semiconductor region The buffer semiconductor region is formed between the collector semiconductor region and the second conductivity type base semiconductor region. This IGBT semiconductor device is configured as a punch-through IGBT semiconductor device.

With respect to the punch-through IGBT semiconductor device, the collector semiconductor region may shares a boundary with the buffer semiconductor region. Further, with this type of semiconductor device, it is preferred that the position of maximum concentration of non-conductive impurities is located in the vicinity of the boundary between the collector semiconductor region and the buffer semiconductor region.

The reverse-recovery characteristics of the semiconductor device are improved if complex defects are formed in the vicinity of the boundary between the collector semiconductor region and the buffer semiconductor region.

With respect to the aforementioned IGBT semiconductor device, the collector semiconductor region may be formed as a plurality of collector semiconductor regions, dispersed between the collector electrode and the second conductivity type base semiconductor region. With this type of semiconductor device, the collector electrode and the second conductivity type base semiconductor region are electrically connected via the open space between the collector semiconductor regions. This IGBT semiconductor device is configured as a collector-short IGBT semiconductor device.

With respect to the collector-short IGBT semiconductor device, the collector semiconductor region may shares a boundary with the second conductivity type base semiconductor region. Further, with this type of semiconductor device, it is preferred that the position of maximum concentration of non-conductive impurities is located in the vicinity of the boundary between the collector semiconductor region and the second conductivity type base semiconductor region.

The reverse-recovery characteristics of the semiconductor device are improved if complex defects are formed in the vicinity of the boundary between the collector semiconductor region and the second conductivity type base semiconductor region.

With respect to the aforementioned IGBT semiconductor device, it is preferred that the non-conductive impurities have a maximum concentration that is greater than or equal to twice the minimum concentration along the direction that joins the collector semiconductor region and the emitter semiconductor region That the non-conductive impurities are distributed in such a way indicates that the non-conductive impurities have been introduced intentionally into the semiconductor device. It is clear that the technical concepts of the present invention are utilized with semiconductor devices having the above characteristic.

By introducing a large quantity of impurities into a semiconductor region, the variation in the impurities intrinsically contained in semiconductor devices becomes negligible. As a result, the variation of complex defects that are formed also becomes negligible, and a semiconductor device with predetermined characteristics can be stably obtained.

DETAILED DESCRIPTION OF THE INVENTION

Description of the Preferred Features

The features of the present invention will be described below.

(First Feature)

Silicon, gallium arsenide, silicon carbide, cadmium, germanium, gallium nitride, etc. may be utilized as the semiconductor material of the semiconductor region. If silicon material is utilized, then carbon, oxygen, nitrogen, fluorine, argon, silicon, or germanium is used as the impurity. If gallium arsenide material is utilized, then silicon, oxygen, carbon, or nitrogen is used as the impurity. If silicon carbide is utilized, then oxygen or nitrogen is used as the impurity. If cadmium is utilized, then the carbon, oxygen, or nitrogen is used as the impurity. If germanium is utilized, then carbon, oxygen, or nitrogen is used as the impurity. If gallium nitride is utilized, then carbon or oxygen is used as the impurity.

(Second Feature)

The maximum concentration of impurities introduced in the step of introducing impurities and the depth of these impurities are determined by a dose quantity (Dose1) and the half width of the injected energy (FWHM1), and the maximum concentration of impurities is represented as Dose1/FWHM1. It is preferred that this maximum impurity concentration (Dose1/FWHM1) is greater than the impurity concentration intrinsically contained in the semiconductor region (ND). That is, it is preferred that a relationship is realized wherein ND<Dose1/FWHM1.

(Third Feature)

Hydrogen, heavy hydrogen, helium-3 and/or helium-4 can be utilized as the light ions that are irradiated when point defects are formed. The maximum concentration of light ions that are introduced into the semiconductor region is determined by a dose quantity (Dose2) and the half width of the injected energy (FWHM2), and is represented as Dose2/FWHM2. It is preferred that this maximum introduced concentration (Dose2/FWHM2) is greater than the sum of the impurity concentration intrinsically contained in the semiconductor region (ND) and the maximum impurity concentration (Dose1/FWHM1). That is, it is preferred that a relationship is realized wherein ND+Dose1/FWMHM1<Dose2/FWHM2.

DESCRIPTION OF THE PREFERRED EMBODIMENTS

Figure 5:
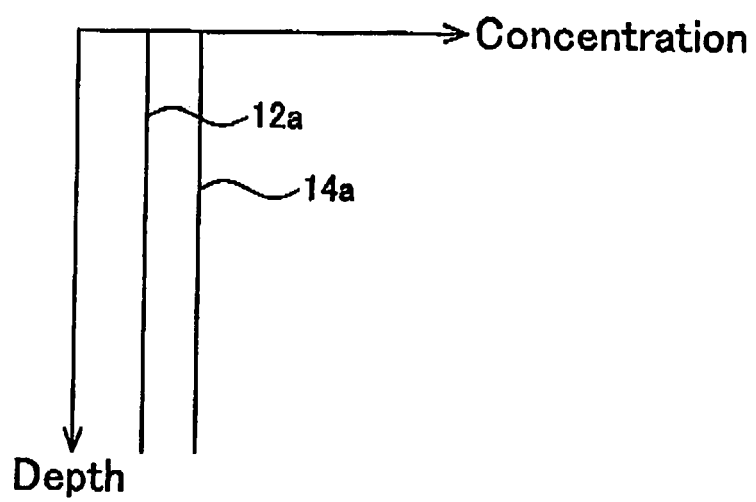
FIG. 5 shows the distribution of impurity concentrations intrinsically contained within the intermediate semiconductor region of the present embodiment.
Figure 6:
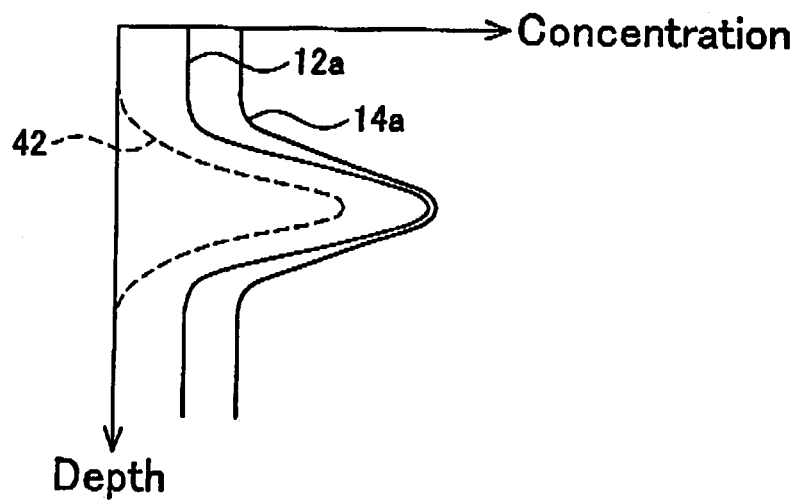
FIG. 6 shows the distribution of the impurity concentrations in the intermediate semiconductor region after carbon ions have been injected.
Figure 7:
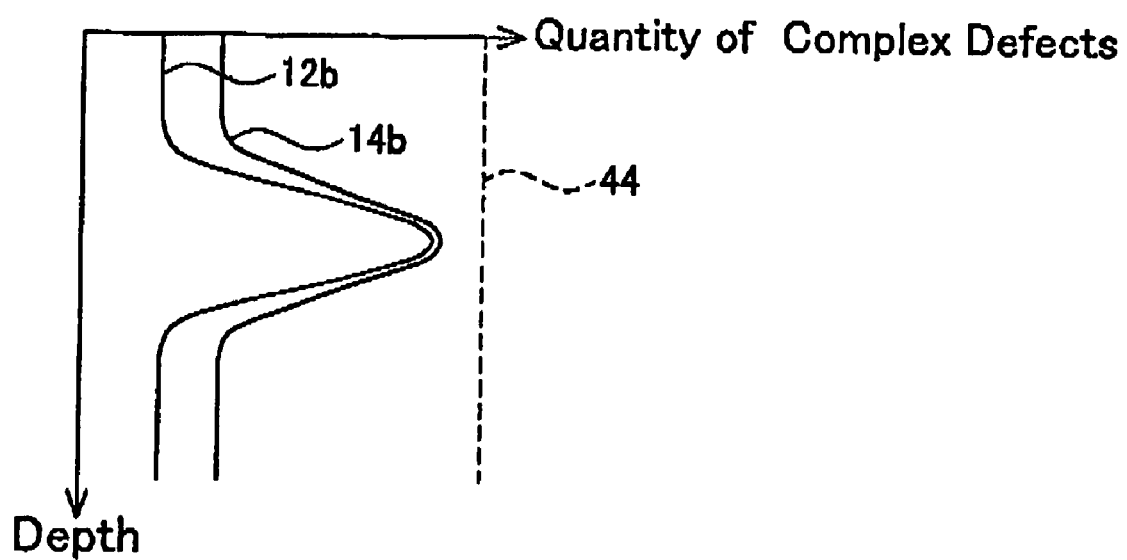
FIG. 7 shows the distribution of the complex defects in the intermediate semiconductor regions of the present embodiment.

A method of forming complex defects in PIN type diode 10 will be described with reference to FIGS. 1 to 7. FIGS. 1 to 4 show cross-sectional views of essential parts of the PIN type diode 10. FIGS. 1 to 4 also show manufacturing flows of the PIN type diode 10. FIGS. 5 and 6 show the distribution of impurity concentrations along a depth direction of an intermediate semiconductor region 24. FIG. 7 shows the distribution of complex defects along a depth direction of the intermediate semiconductor region 24.

Figure 1:
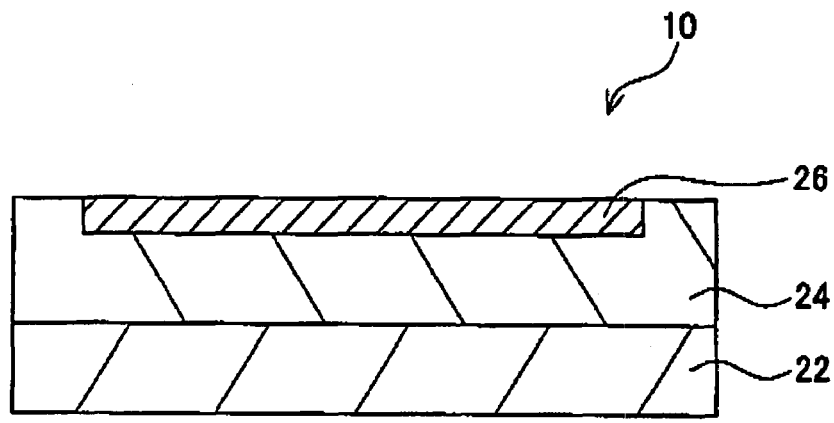
FIG. 1 shows a cross-sectional view of essential portions of a semiconductor layer provided with a PIN type diode of the present embodiment.

First, as shown in FIG. 1, a semiconductor stack is prepared, and the semiconductor stack consists of $n^+$ type cathode semiconductor region 22, $n^-$ type (or i type) intermediate semiconductor region 24, and $p^+$ type anode semiconductor region 26, which are stacked together. The semiconductor stack is made from silicon wafers. The cathode semiconductor region 22 is formed by injecting phosphorus ions into the bottom surface of an $n^-$ type silicon wafer, followed by thermal diffusion. The anode semiconductor region 26 is formed by injecting boron ions into the top surface of an $n^-$ type silicon wafer, followed by thermal diffusion. The same thermal diffusion process can be performed to form both the cathode semiconductor region 22 and the anode semiconductor region 26.

Impurities from the ingot stage are present in the semiconductor stack. One of these impurities is carbon. In the present embodiment, the concentration of carbon intrinsically contained within the intermediate semiconductor region 24 is approximately $2 \times 10^{14}$ cm$^{-3}$. The concentration of carbon can be determined by, for example, converting from the absorbency of infrared absorption measurements. The concentration of intrinsically contained carbon is approximately uniform along the depth direction of the intermediate semiconductor region 24. FIG. 5 shows the distribution of the carbon concentration of the intermediate semiconductor regions 24 in the depth direction. In FIG. 5, the carbon concentrations of the intermediate semiconductor regions 24 obtained from different silicon wafers are shown by 12a and 14a. The carbon concentration originally contained differs for each silicon wafer.

Figure 2:
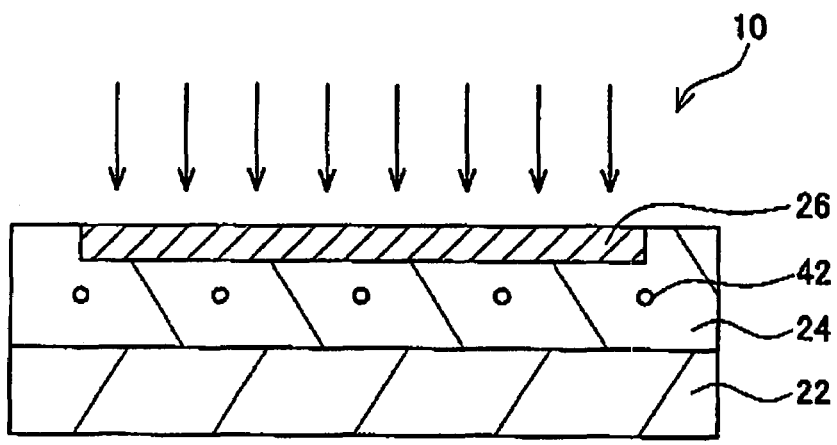
FIG. 2 shows a process of injecting carbon ions into an intermediate semiconductor region.

Next, as shown in FIG. 2, carbon ions are injected toward the intermediate semiconductor region 24 from the anode semiconductor region 26 side. It is preferred that the depth at which the carbon ions are injected is set to be in the vicinity of the boundary between the anode semiconductor region 26 and the intermediate semiconductor region 24. It is even more preferred that the depth at which the carbon ions are injected is eccentrically located slightly more towards the intermediate semiconductor region 24 than at the above-mentioned boundary. After the carbon ions are injected, it is preferred that the semiconductor region is heated with a heating process set between 800 degrees Celsius and 1300 degrees Celsius. By performing this heating process, the damage incurred by the anode semiconductor region 26 and the intermediate semiconductor region 24 when the carbon ions were injected can be recovered. Further, by performing the heating process, the introduced carbon ions can be displaced in the lattice location of the intermediate semiconductor region 24, and substitutional carbon 42 is consequently formed. If the beating process is below 800 degrees Celsius, the efficiency in forming substitutional carbon 42 decreases. Further, a heating process of above 1300 degrees Celsius is undesirable because the silicon would melt. It is therefore preferred that the heating process is set to be between 800 degrees Celsius and 1300 degrees Celsius. When these steps are performed, the maximum concentration of substitutional carbon 42 in the local region of the intermediate semiconductor region 24 is adjusted to approximately $1 \times 10^{15}$ cm$^{-3}$.

FIG. 6 shows the distribution of carbon concentration in the depth direction of the intermediate semiconductor regions 24 after the carbon ions have been injected. Broken line 42 in FIG. 6 shows the concentration distribution of substitutional carbon 42 which has been introduced to the intermediate semiconductor region 24. 12a of FIG. 6 shows the concentration distribution of carbon included in the intermediate semiconductor region 24 of 12a of FIG. 5 after substitutional carbon 42 has been introduced. 14a of FIG. 6 shows the concentration distribution of carbon included in intermediate semiconductor region 24 of 14a of FIG. 5 after substitutional carbon 42 has been introduced. As shown in FIG. 6, substitutional carbon 42 which was introduced is much greater in quantity than the quantity of carbon intrinsically contained in the intermediate semiconductor region 24. As a result, after the substitutional carbon 42 has been introduced, the difference between carbon concentrations 12a and 14a at the injected depth (the intermediate semiconductor regions 24) becomes relatively smaller. In FIGS. 5 and 6, the concentration shown on the horizontal axis has a logarithmic scale. That is, the difference between carbon concentrations 12a and 14a of the intermediate semiconductor regions 24 obtained from different silicon wafers becomes substantially negligible.

The depth at which the carbon is injected and the carbon concentration becomes maximum can easily be controlled by adjusting the half width of the injected energy (FWHM1) and the quantity of the dose (Dose1). In the case of light ions such as carbon, the depth at which the carbon is injected and the carbon concentration becomes maximum can be controlled within a range of several sum from the top surface of the semiconductor stack. The maximum carbon concentration can be estimated from the half width of the injected energy (FWHM1) and the quantity of the dose (Dose1), and can be represented as Dose1/FWHM1.

Figure 3:
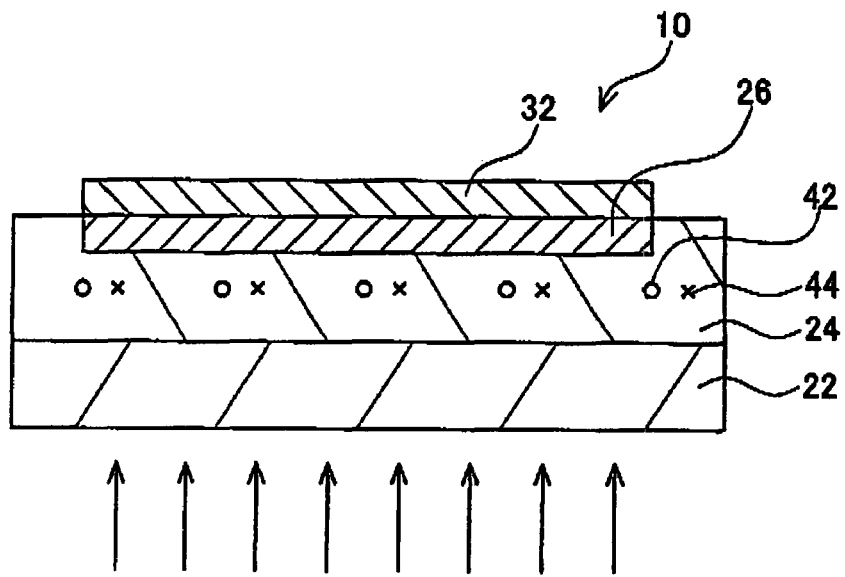
FIG. 3 shows a process of irradiating the intermediate semiconductor region with helium ions.

Next, as shown in FIG. 3, anode electrode 32 is formed at the top surface of anode semiconductor region 26. After anode electrode 32 is formed, helium ions are irradiated toward the intermediate semiconductor region 24 from the cathode semiconductor region 22 side. Point defects 44 are formed in the intermediate semiconductor region 24 which has been irradiated with the helium ions. The helium ions are irradiated from the cathode semiconductor region 22 side in order to prevent charge-up damage to an oxide film formed at the anode side. However, helium ions may also be irradiated from the anode side as necessary. At this juncture, the depth of the intermediate semiconductor region 24 at which the maximum quantity of point defects 44 is to be formed is adjusted to approximately conform to the position at which the maximum concentration of the substitutional carbon 42 is introduced. In other words, the region in the intermediate semiconductor region 24 at which the maximum concentration of substitutional carbon 42 is introduced has approximately the same depth as the region in the intermediate semiconductor region 24 where the maximum quantity of point defects 44 is formed. The depth of the intermediate semiconductor region 24 where the maximum quantity of point defects 44 is formed conforms approximately to the depth at which the maximum concentration of helium ions is introduced. As a result, the depth of the intermediate semiconductor region 24 at which the maximum quantity of point defects 44 are formed can easily be controlled by adjusting the half width of the irradiation energy of the helium ions (FWHM2) and the quantity of the dose (Dose2). The maximum introduced concentration of helium ions can be estimated from the half width of the irradiation energy (FWHM2) and the quantity of the dose (Dose2), and can be represented as Dose2/FWHM2. The maximum concentration of helium ions is approximately $5 \times 10^{15}$ cm$^{-3}$.

Figure 4:
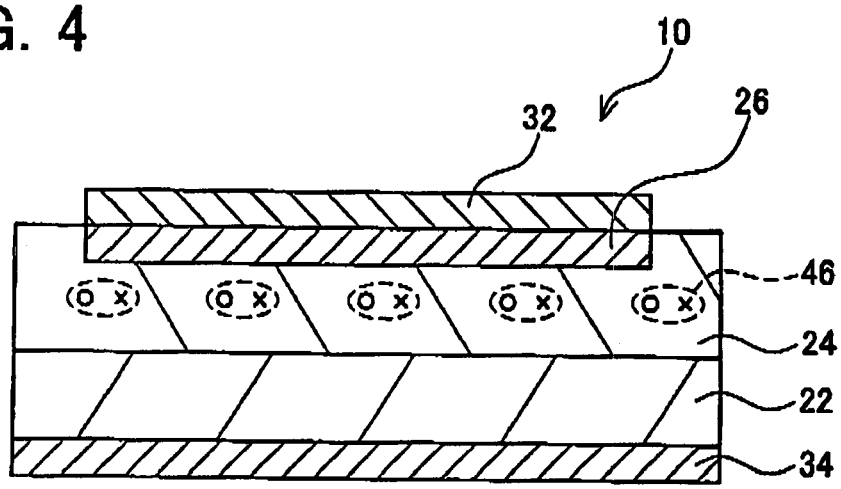
FIG. 4 shows a process of forming complex defects in the intermediate semiconductor region.

Next, as shown in FIG. 4, a heating process is performed in the range between 200 degrees Celsius and 600 degrees Celsius. By performing this heating process, the carbon contained in the intermediate semiconductor region 24 (including both the intrinsically contained carbon and substitutional carbon 42 which was previously introduced) and point defects 44 are combined to form complex defects 46. If the heating process is below 200 degrees Celsius, the efficiency in forming complex defects 46 decreases. A heating process above 600 degrees Celsius is undesirable because the defects may be diffused or destroyed. It is therefore preferred that the heating process is performed at a temperature between 200 degrees Celsius and 600 degrees Celsius.

As shown in FIG. 7, point defects 44 are formed in a quantity that is greater than the carbon concentration of the intermediate semiconductor region 24. When a large quantity of point defects 44 are formed, quantities of complex defects 12b and 14b are determined based on carbon concentrations 12a and 14a of intermediate semiconductor region 24. As a result, the difference between quantities of complex defects 12b and 14b become substantially negligible because the difference between carbon concentrations 12a and 14a is negligible. There is consequently no variation in the characteristics of the semiconductor devices that are obtained. The yield of semiconductor devices can thus be increased by utilizing the aforementioned manufacturing method.

Explaining the step for forming complex defects 46 in more detail, the following phenomenon occurs. When the helium ions are irradiated into the intermediate semiconductor region 24, substitutional silicon is ejected, thus forming vacancies (V: an example of a point defect) and interstitial silicon (I: an example of a point defect). Vacancies (V) and interstitial silicon (I) are thermally unstable. As a result, vacancies (V) and interstitial silicon (I) are thermally stabilized by being combined with surrounding impurities (oxygen or carbon). For example, vacancies (V) and oxygen combine to form complex defects (to function as an electron trap) that have an energy level of approximately 0.19 eV below the conduction band. Further, interstitial carbon (Ci) is formed by replacing substitutional carbon 42 with interstitial silicon (I). Interstitial carbon (Ci) and oxygen combine to form complex defects (to function as a positive hole trap) that have an energy level of approximately 0.35 eV above the valence band.

In the above embodiment, by introducing a large quantity of the carbon ions, the concentration of carbon (including both the concentration of carbon intrinsically contained and the concentration of substitutional carbon 42 which was intentionally introduced) in intermediate semiconductor regions 24 obtained from different silicon wafers can be uniformized. Therefore, complex defects 46 which function as positive hole taps in intermediate semiconductor regions 24 obtained from different silicon wafers can also be uniformized. The lifetime of PIN type diode 10 can be controlled by forming complex defects 46 in intermediate semiconductor regions 24, and PIN type diode 10 can be realized with reduced loss, reduced recovery surge voltage, etc. By using the manufacturing method of the present embodiment, PIN type diodes 10 which have equivalent switching characteristics can be obtained in a stable manner even when a plurality of PIN type diodes 10 are manufactured.

Moreover, if required, complex defects that function as electron traps can be made uniform, by means of injecting a large quantity of oxygen in intermediate semiconductor regions 24 obtained from different silicon wafers. In this case, similarly, the switching characteristics can be improved.

The following variants can be adopted in the aforementioned manufacturing method.

(1) In the method of forming point defects, electron beam irradiation, γ beam irradiation, neutrons, etc. may be utilized instead of helium ion irradiation.

(2) The step of ion-injection of impurities (carbon in the example above), may be performed after the point defects have been formed. Alternatively, this step may be performed simultaneously with the step of forming the point defects.

(3) A PIN type diode was used in the aforementioned example. However, an IGBT (Insulated Gate Bipolar Transistor), MOSFET (Metal Oxide Semiconductor Field Effect Transistor), Bipolar Transistor, thyristor, etc. may equally well be utilized.

Second Embodiment

Figure 8:
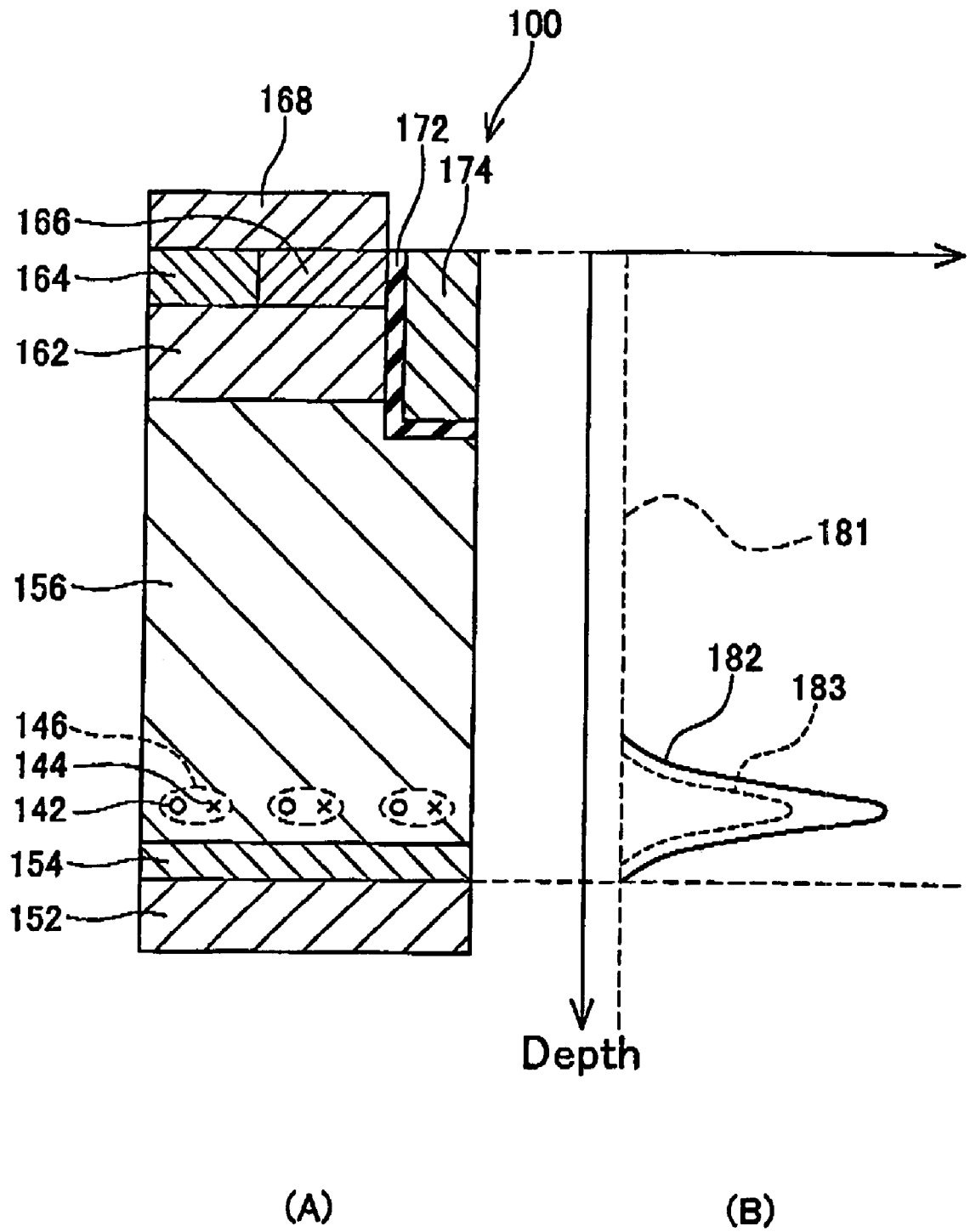
FIG. 8(A) shows a simplified cross-sectional diagram of a essential parts of a semiconductor device according to the second embodiment.
FIG. 8(B) shows the concentration distribution of carbon and complex defects.

Shown in FIG. 8(A) is a simplified cross-sectional diagram of essential parts of semiconductor device 100. The semiconductor device 100 is a type of non-punch-through IGBT (Insulated Gate Bipolar Transistor) semiconductor device. FIG. 8(A) shows the unit structure of the semiconductor 100. The semiconductor 100 is made from silicon wafers.

The semiconductor 100 comprises a collector electrode 152, which is a stacked layer formed by stacking aluminum, titanium, and nickel.

A collector semiconductor region 154 which includes $p^+$ type impurities (typically boron) is formed above the collector electrode 152. The concentration of impurities in the collector semiconductor region 154 is adjusted to be approximately $1 \times 10^{18}$ cm$^{-3}$.

A n-type base semiconductor region 156 which includes n-type impurities (typically phosphorus) is formed above the collector semiconductor region 154. The concentration of impurities in the n-type base semiconductor region 156 is adjusted to be approximately $7 \times 10^{13}$ cm$^{-3}$.

A p-type base semiconductor region 162 which includes p-type impurities (typically boron) is formed above the n-type base semiconductor region 156. The p-type base semiconductor region 162 is separated from the collector semiconductor region 154 by the n-type base semiconductor region 156. The concentration of impurities in the p-type base semiconductor region 162 is adjusted to be approximately $1 \times 10^{17}$ to $5 \times 10^{17}$ cm$^{-3}$.

An emitter semiconductor region 166 which includes n-type impurities (typically phosphorus) is selectively formed above the p-type base semiconductor region 162. The emitter semiconductor region 166 is separated from the n-type base semiconductor region 156 by the p-type base semiconductor region 162. The concentration of impurities in the emitter semiconductor region 166 is adjusted to be approximately $1 \times 10^{19}$ to $1 \times 10^{20}$ cm$^{-3}$.

A base contact semiconductor region 164 which includes p-type impurities (typically boron) is selectively formed above the p-type base semiconductor region 162. The concentration of impurities in the base contact semiconductor region 164 is adjusted to be approximately $1 \times 10^{19}$ to $1 \times 10^{20}$ cm$^{-3}$.

A trench gate electrode 174 faces, via a gate insulating film 172, the portion of the p-type base semiconductor region 162 that separates the emitter semiconductor region 166 and the n-type base semiconductor region 156. The gate insulating film 172 is made of oxide silicon. The trench gate electrode 174 is made of polysilicon.

An emitter electrode 168 made of aluminum is formed above the emitter semiconductor region 166 and the base contact semiconductor region 164. The emitter electrode 168 is connected to the emitter semiconductor region 166 and the base contact semiconductor region 164. The emitter electrode 168 and the trench gate electrode 174 are electrically isolated from one another.

In the semiconductor device 100, the complex defects 146 which were formed by the combining of carbon (including both the intrinsically contained carbon and the substitutional carbon 142 introduced afterwards) and the point defects 144 are formed in the vicinity of the boundary between the collector semiconductor region 154 and the n-type base semiconductor region 156. FIG. 8(B) shows the concentration distribution of carbon and concentration distribution of the complex defects 146 along the direction that joins the collector semiconductor region 154 and the emitter semiconductor region 166. Broken line 181 represents the concentration distribution of carbon intrinsically contained in a silicon wafer. Solid line 182 represents the concentration distribution of the substitutional carbon 142 which was introduced later on. Broken line 183 represents the concentration distribution of the complex defects 146. The depth where the concentration of the substitutional carbon 142 is highest and the depth at which the largest quantity of the complex defects 146 are formed are both locally located in the vicinity of the boundary between the collector semiconductor region 154 and the n-type base semiconductor region 156. The complex defects 146 provide locations where electrons and positive holes recombine, thereby improving reverse-recovery characteristics.

The semiconductor 100 is manufactured according to the following procedure.

First, a silicon wafer having a phosphorus concentration of $7 \times 10^{13}$ cm$^{-3}$ is prepared. A CZ substrate which has been formed by the Czochralaki method can be utilized for this silicon wafer. Next, using ion injection, the p-type base semiconductor region 162 is formed by injecting boron from the top surface of the silicon wafer. Further, using ion injection, the emitter semiconductor region 166 is formed by injecting phosphorus from the top surface of the p-type base semiconductor region 162. Further, using ion injection, the base contact semiconductor region 164 is selectively formed by selectively injecting boron from the top surface of the p-type base semiconductor region 162. Next, a trench that penetrates p-type base semiconductor region 162 is formed from the top surface of the silicon wafer by means of etching. The side walls of the trench are coated with the gate insulating film 172. Then, the trench electrode 174 is filled into the trench, which has been coated with the gate insulating film 172. Next, the emitter electrode 168, which is connected to the emitter semiconductor region 166 and the base contact semiconductor region 164, is formed.

Next, using high-energy ion injection, the substitutional carbon 142 is introduced at a predetermined depth of the silicon wafer by injecting carbon ions from the bottom surface of the silicon wafer. The depth at which the substitutional carbon 142 is introduced is set to be in the vicinity of the boundary between the collector semiconductor region 154 (to be formed later) and the n-type base semiconductor region 156. It is preferred that the depth at which the substitutional carbon 142 is injected is eccentrically located slightly more towards the intermediate semiconductor region 24 than at the above-mentioned boundary. The concentration of the substitutional carbon 142 is set to be higher than the concentration of carbon intrinsically contained in the silicon wafer.

Next, using ion injection, boron is injected from the bottom surface of the silicon wafer. The region where the boron is introduced corresponds to an area of the collector semiconductor region 154. Next, a heating process is implemented at or below 600 degrees Celsius and the introduced boron is activated to form the collector semiconductor region 154. The complex defects 146 are simultaneously formed with this heating process. The point defects 144 were simultaneously formed when the step of injecting carbon ions and the step of injecting boron were implemented. Therefore, by this heating process, the substitutional carbon 142 and the point defects 144 combine to form the complex defects 146.

Next, the collector electrode 152 is deposited on the bottom surface of the silicon wafer. Through these steps, the semiconductor device 100 can be manufactured.

In this second embodiment, by introducing a large quantity of carbon, the variation in the concentration of carbon in different silicon wafers becomes negligible. Accordingly, the complex defects 146, which function as positive hole traps, are formed uniformly among the different silicon wafers. Once the complex defects 146 are formed in the vicinity of the boundary between the collector semiconductor region 154 and the n-type base semiconductor region 156, it becomes possible to control the lifetime of carriers, and the semiconductor 100 can be realized with reduced loss, reduced recovery surge voltage, etc. Even if a plurality of the semiconductor devices 100 are manufactured, the plurality of the semiconductor devices 100, which all have similar switching characteristics, can be stably obtained by utilizing the manufacturing method of the present embodiment.

When a large quantity of oxygen is injected, if the need arises, complex defects which function as electron traps can be uniformly formed among different silicon wafers. In this case, switching characteristics can be similarly improved.

Third Embodiment

Figure 9:
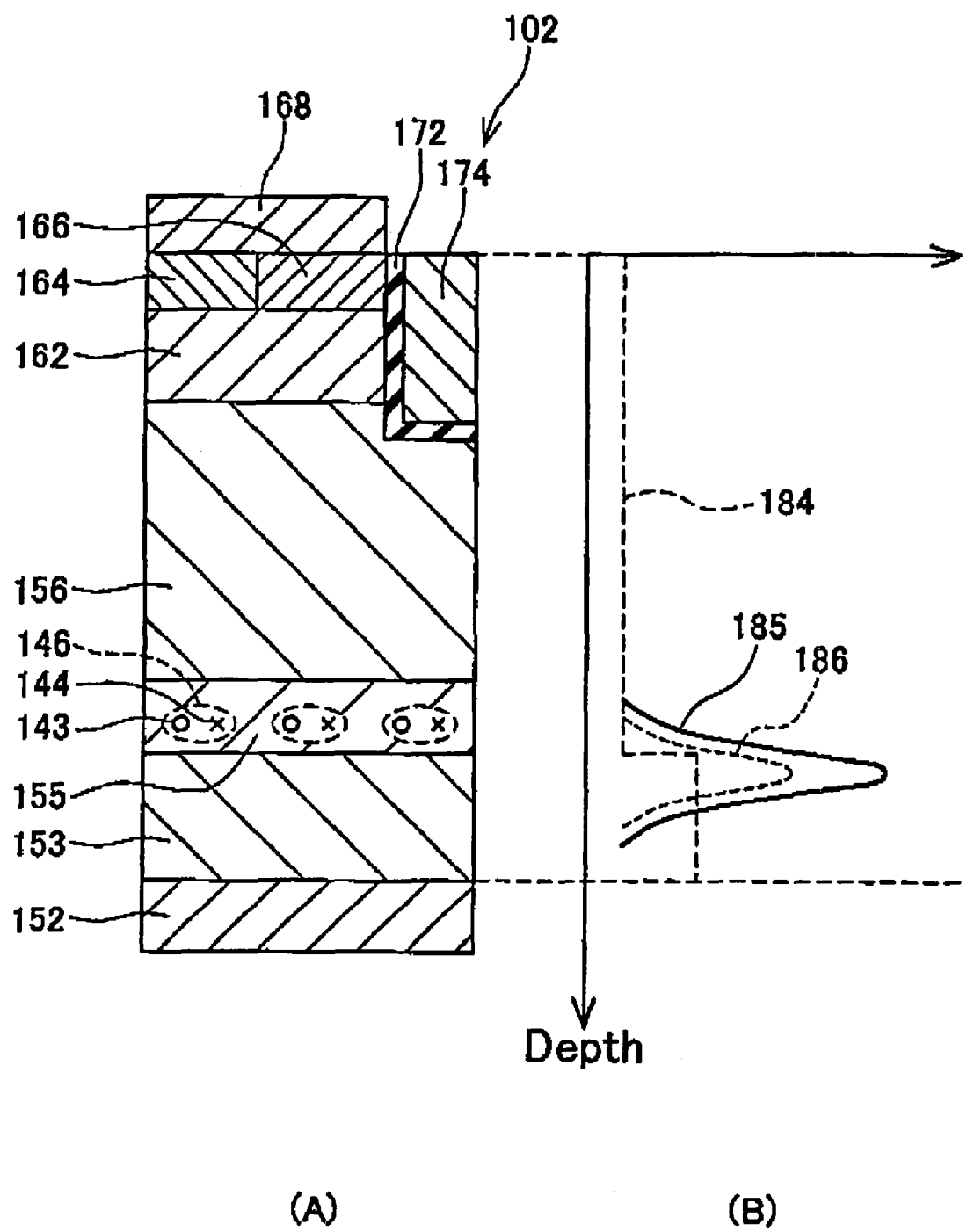
FIG. 9(A) shows a simplified cross-sectional diagram of a essential parts of a semiconductor device according to the third embodiment.
FIG. 9(B) shows the concentration distribution of oxygen and complex defects.

Shown in FIG. 9(A) is a simplified cross-sectional diagram of essential parts of the semiconductor device 102. The semiconductor device 102 is a type of punch-through IGBT (Insulated Gate Bipolar Transistor) semiconductor device. FIG. 9(A) shows the unit structure of the semiconductor device 102. The semiconductor device 102 is made from silicon wafers. Component parts of the semiconductor device 102 that are practically the same as in the semiconductor device 100 of FIG. 8(A) will be represented with the same numerals, and descriptions thereof will be omitted.

The semiconductor device 102 comprises a buffer semiconductor region 155, which includes n-type impurities phosphorus). The buffer semiconductor region 155 is disposed between a collector semiconductor region 153 and the n-type base semiconductor region 156. Further, the semiconductor device 102 is characterized in that thickness thereof is relatively thick. The concentration of impurities of a buffer semiconductor region 155 is adjusted to be approximately above $1 \times 10^{17}$ cm$^{-3}$. The concentration of impurities of the collector semiconductor region 153 is adjusted to be $1 \times 10^{18}$ cm$^{-3}$.

In the semiconductor device 102, the complex defects 146 which were formed by the combining of oxygen (including both the intrinsically contained oxygen and the introduction oxygen 143 introduced afterwards) and point defects 144 are formed in the vicinity of the boundary between the collector semiconductor region 154 and the n-type base semiconductor region 156. FIG. 9(B) shows the concentration distribution of oxygen and concentration distribution of the complex defects 146 along the direction that joins the collector semiconductor region 153 and the emitter semiconductor region 166. Broken line 184 represents the concentration distribution of oxygen intrinsically contained in a silicon wafer. Solid line 185 represents the concentration distribution of the introduction oxygen 143 which was introduced later on. Broken line 186 represents the concentration distribution of the complex defects 146. The depth where the concentration of the introduction oxygen 143 is highest and the depth at which the largest quantity of the complex defects 146 are formed are both locally located in the vicinity of the boundary between the collector semiconductor region 153 and the buffer semiconductor region 156. The complex defects 146 provide locations where electrons and positive holes recombine, thereby improving reverse-recovery characteristics.

The semiconductor 102 is manufactured according to the following procedure.

First, a silicon wafer having a boron concentration of $1 \times 10^{18}$ cm$^{-3}$ is prepared. This silicon wafer becomes the collector semiconductor region 153. A CZ substrate which has been formed by the Czochralaki method can be utilized for this silicon wafer. Then, by utilizing epitaxial growth, the buffer semiconductor region 155 is grown from the top surface of the silicon wafer. Next, using ion injection, the introduction oxygen 143 is formed at a predetermined depth of the buffer semiconductor region 155 by injecting oxygen ions from the top surface of the buffer semiconductor region 155. It is preferred that the depth at which the introduction oxygen 143 is formed is set to be in the vicinity of the boundary between the collector semiconductor region 153 (to be formed later) and the buffer semiconductor region 155. It is even more preferred that the depth at which the introduction oxygen 143 is formed be located slightly more towards the buffer semiconductor region 155 side than at the above-mentioned boundary. The concentration of the introduction oxygen 143 is set to be higher than the concentration of oxygen intrinsically contained.

Next, utilizing epitaxial growth, the p-type base semiconductor region 162 is grown from the top surface of the buffer semiconductor region 155. Then, using ion injection, the emitter semiconductor region 166 is formed by selectively injecting phosphorus from the top surface of the p-type base semiconductor region 162. Further, using ion injection, the base contact semiconductor region 164 is selectively formed by selectively injecting boron from the top surface of the p-type base semiconductor region 162. Next, a trench that penetrates the retype base semiconductor region 162 is formed from the top surface of the silicon wafer by means of etching. The side walls of the trench are coated with the gate insulating film 172. Then, the trench electrode 174 is filled into the trench, which has been coated with the gate insulating film 172. Next, the emitter electrode 168, which is connected to the emitter semiconductor region 166 and the base contact semiconductor region 164, is formed.

Next, helium ions are irradiated from the bottom surface of the silicon wafer towards the vicinity of the boundary of the collector semiconductor region 153 and the buffer semiconductor region 155. The point defects 144 are formed in the region where the helium ions were irradiated. The depth at which the largest quantity of the point defects 144 is formed is adjusted to conform approximately with to the position where the maximum concentration of the introduction oxygen 143 is introduced.

Next, a heating process is implemented at or below 600 degrees Celsius, where the oxygen (including both the intrinsically contained oxygen and the introduction oxygen 143 introduced afterwards) and the point defects 144 combine to form the complex defects 146.

Next, the collector electrode 152 is deposited on the bottom surface of the silicon wafer. By completing the aforementioned steps, the semiconductor 102 can be manufactured.

In this third embodiment, by introducing a large quantity of oxygen, the variation in the concentration of oxygen in different silicon wafers becomes negligible. Accordingly, the complex defects 146, which function as electron traps, are formed uniformly among the different silicon wafers. Once the complex defects 146 are formed in the vicinity of the boundary between the collector semiconductor region 153 and the base semiconductor region 155, it becomes possible to control the lifetime of carriers, and the semiconductor device 102 can be realized with reduced loss, reduced recovery surge voltage, etc. Even if a plurality of the semiconductor devices 102 are manufactured, the plurality of the semiconductor devices 102, which all have similar switching characteristics, can be stably obtained by utilizing the manufacturing method of the present embodiment.

When a large quantity of carbon is injected, if the need arises, complex defects which function as positive hole traps can be uniformly formed among different silicon wafer. In this case, switching characteristics can be similarly improved.

Fourth Embodiment

Figure 10:
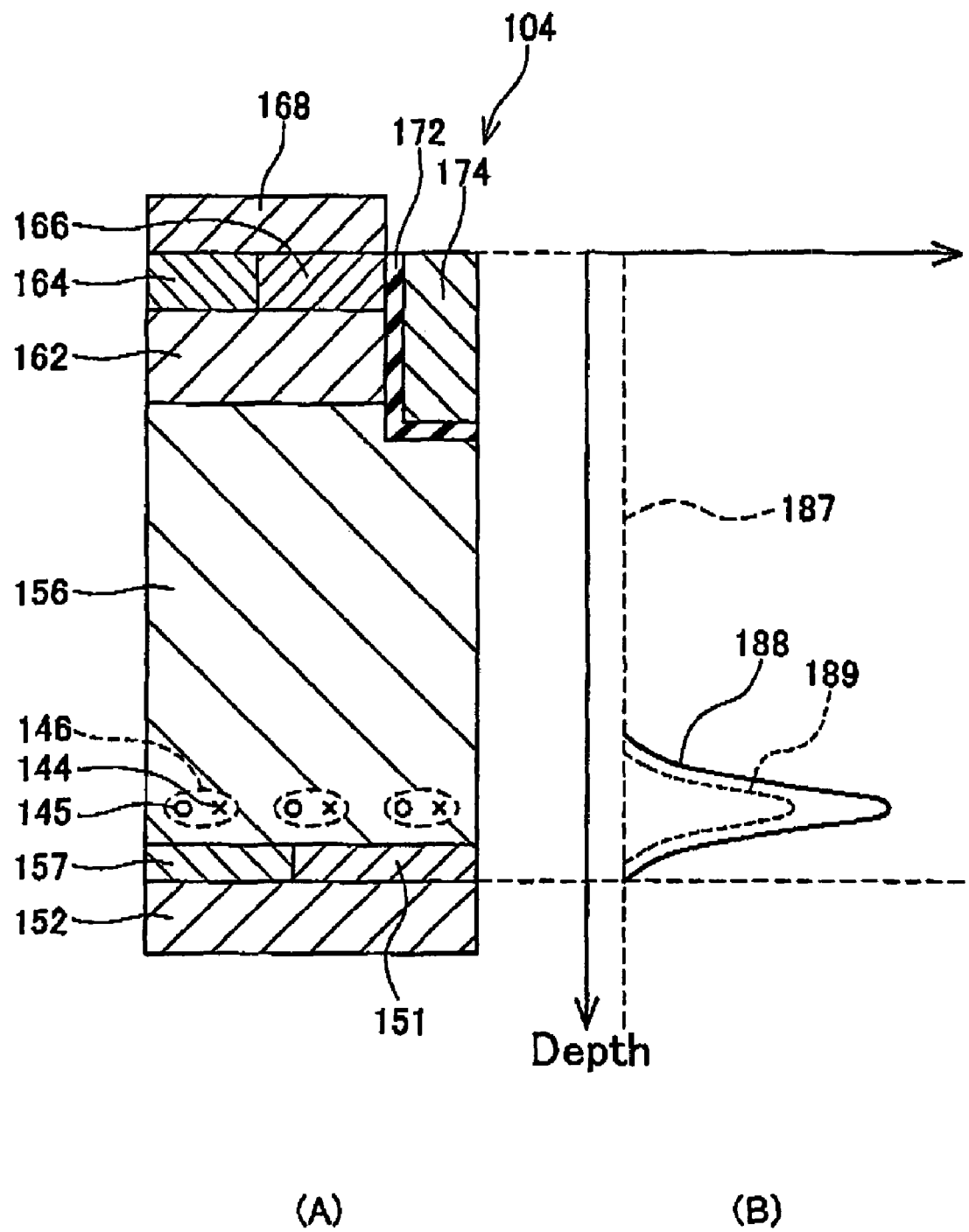
FIG. 10(A) shows a simplified cross-sectional diagram of a essential parts of a semiconductor device according to the fourth embodiment.
FIG. 10(B) shows the concentration distribution of nitrogen and complex defects.
Figure 11:
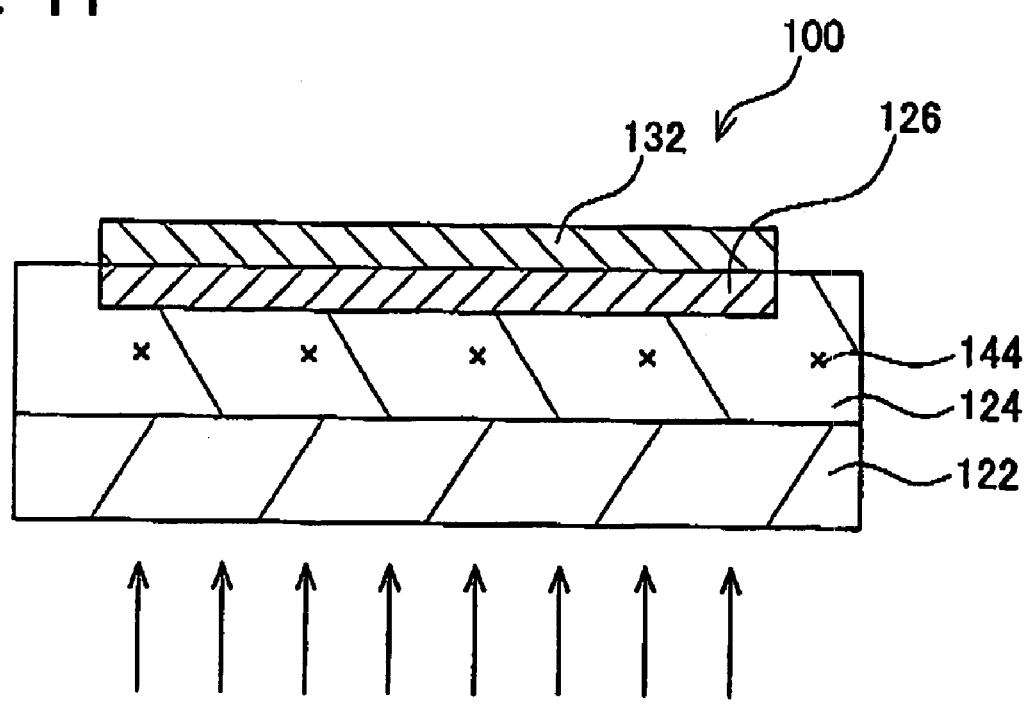
FIG. 11 shows a conventional process of forming complex defects.
Figure 12:
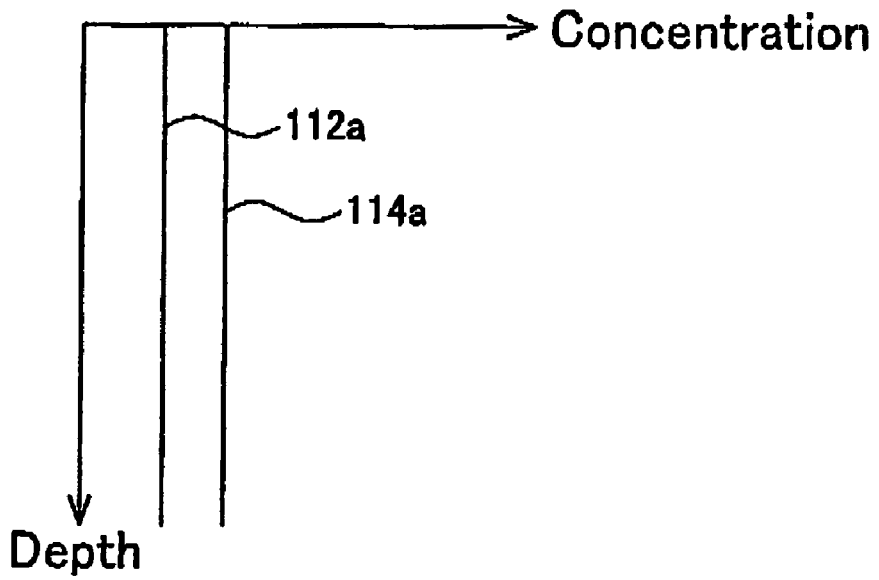
FIG. 12 shows the distribution of impurity concentrations intrinsically contained within a conventional intermediate semiconductor region.
Figure 13:
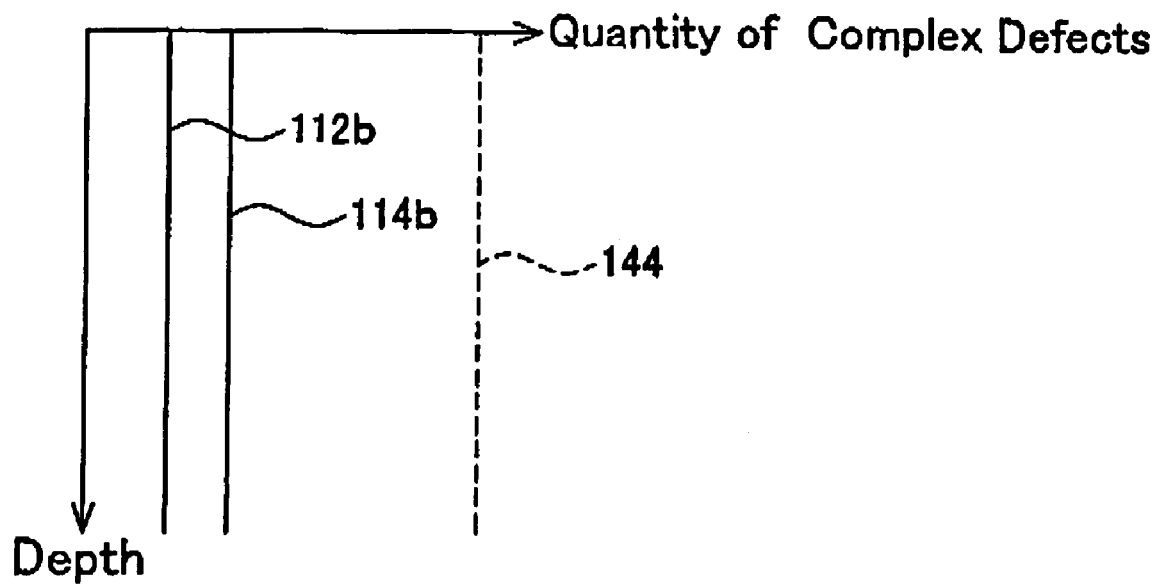
FIG. 13 shows the distribution of complex defects in a conventional intermediate semiconductor region.

Shown in FIG. 10(A) is a simplified cross-sectional diagram of essential parts of a semiconductor device 104. The semiconductor device 104 is a type of collector-short IGBT (Insulated Gate Bipolar Transistor) semiconductor device. FIG. 10(A) shows the unit structure of the semiconductor device 104. The semiconductor device 104 is made from silicon wafers. Component parts of the semiconductor device 104 that are practically the same as in the semiconductor device 100 of FIG. 8(A) will be represented with the same numerals, and descriptions thereof will be omitted.

In the semiconductor device 104, a plurality of collector semiconductor regions 157 is dispersively formed between the collector electrode 152 and the n-type base semiconductor region 156. A collector-short semiconductor region 151, which include n-type impurities (phosphorus), is formed between the collector semiconductor regions 157. The thickness of the collector semiconductor region 157 and the thickness of the collector-short semiconductor region 151 are adjusted to be approximately equal. The concentration of impurities in the collector-short semiconductor region 151 is adjusted to be approximately above $1 \times 10^{19}$ cm$^{-3}$. The collector electrode 152 and the n-type base semiconductor region 156 are electrically connected via the collector-short semiconductor region 151.

In semiconductor device 104, the complex defects 146 which were formed by the combining of nitrogen (including both the intrinsically contained nitrogen and the introduction nitrogen 145 introduced afterwards) and point defects 144 are formed in the vicinity of the boundary between the collector semiconductor region 157 and the n-type base semiconductor region 156. FIG. 10(B) shows the concentration distribution of nitrogen and concentration distribution of the complex defects 146 along the direction that joins the collector semiconductor region 154 and the emitter semiconductor region 166. Broken line 187 represents the concentration distribution of nitrogen intrinsically contained in a silicon wafer. Solid line 188 represents the concentration distribution of the introduction nitrogen 145 which was introduced later on. Broken line 189 represents the concentration distribution of the complex defects 146. The depth where the concentration of the introduction nitrogen 145 is highest and the depth at which the largest quantity of the complex defects 146 are formed are both locally located in the vicinity of the boundary between the collector semiconductor region 157 and the n-type base semiconductor region 156, and in the vicinity of the boundary between the collector-short semiconductor region 151 and the n-type base semiconductor region 156. The complex defects 146 provide locations where electrons and positive holes recombine, thereby improving reverse-recovery characteristics.

The semiconductor 104 is manufactured according to the following procedure.

First, a silicon wafer having a boron concentration of $7 \times 10^{13}$ cm$^{-3}$ is prepared. A CZ substrate which has been formed by the Czochralaki method can be utilized for this silicon wafer. Next, using ion injection, the p-type base semiconductor region 162 is formed by injecting boron from the top surface of the silicon wafer. Further, using ion injection, the emitter semiconductor region 166 is formed by selectively injecting phosphorus from the top surface of the p-type base semiconductor region 162. Further, using ion injection, the base contact semiconductor region semiconductor region 162. Next, a trench that penetrates the p-type base semiconductor region 162 is formed from the top surface of the silicon wafer by means of etching. The side walls of the trench are coated with the gate insulating film 172. Then, the trench electrode 174 is filled into the trench, which has been coated with the gate insulating film 172. Next, the emitter electrode 168, which is connected to the emitter semiconductor region 166 and the base contact semiconductor region 164, is formed.

Next, using high-energy ion injection, the introduction nitrogen 145 is formed at a predetermined depth of the silicon wafer by injecting nitrogen ions from the bottom surface of the silicon wafer. The depth at which the introduction nitrogen 145 is formed is set to be in the vicinity of the boundary between the collector semiconductor region 157 (to be formed later) and the n-type base semiconductor region 156. Further, the depth at which the introduction nitrogen 145 is formed is set to be in the vicinity of the boundary between the collector-short semiconductor region 151 (to be formed later) and the n-type base semiconductor region 156. It is further preferred that the depth at which the introduction nitrogen 145 is injected is eccentrically located slightly more towards the n-type base semiconductor region 156 than at the two boundaries mentioned above. The concentration of the introduction nitrogen 145 is set to be higher than the concentration of carbon intrinsically contained in the silicon wafer.

Next, using ion injection, boron is selectively injected from the bottom surface of the silicon wafer. The region where the boron is introduced corresponds to an area of the collector semiconductor region 157. Using ion injection, phosphorus is selectively injected from the bottom surface of the silicon wafer. The region where the phosphorus is introduced corresponds to an area of the collector-short semiconductor region 151. Next, a laser-annealing method is utilized to activate the introduced boron and phosphorus, and to form the collector semiconductor region 157 and the collector-short semiconductor region 151. Then, a heating process is implemented at or below 600 degrees Celsius to form the complex defects 146. When the step of injecting nitrogen ions, the step of injecting boron, the step of injecting phosphorus, and the step of the laser-anneal were implemented, the point defects 142 were simultaneously formed. Due to this heating process, the point defects 144 and nitrogen (including both the intrinsically contained nitrogen and the introduction nitrogen 145 which was introduced later on) are combined, and the complex defects 146 are formed.

Next, the collector electrode 152 is deposited on the bottom surface of the silicon wafer. Through these steps, the semiconductor device 104 can be manufactured.

In this fourth embodiment, by introducing a large quantity of nitrogen, the variation in the concentration of nitrogen in different silicon wafers becomes negligible. Accordingly, the complex defects 146, which function as electron traps, are formed uniformly among the different silicon wafers. Once the complex defects 146 are formed in the vicinity of the boundary between the collector semiconductor region 157 and the n-type base semiconductor region 156, it becomes possible to control the lifetime of carriers, and the semiconductor 104 can be realized with reduced loss, reduced recovery surge voltage, etc. Even if a plurality of the semiconductor devices 104 are manufactured, the plurality of the semiconductor devices 104, which all have similar switching characteristics, can be stably obtained by utilizing the manufacturing method of the present embodiment.

When a large quantity of carbon is injected, if the need arises, complex defects which function as positive hole traps can be uniformly formed among different silicon wafers. In this case, switching characteristics can be similarly improved.

Specific examples of the present invention are described above in detail, but these examples are merely illustrative and place no limitation on the scope of the patent claims. The technology described in the patent claims also encompasses various changes and modifications to the specific examples described above.

Furthermore, the technical elements explained in the present specification and drawings provide technical value and utility either independently or through various combinations. The present invention is not limited to the combinations described at the time the claims are filed. Further, the purpose of the example illustrated by the present specification and drawings is to satisfy multiple objectives simultaneously, and satisfying any one of those objectives gives technical value and utility to the present invention.

What is claimed is:

1. A semiconductor device comprising:
    a post-heated semiconductor region having complex defects,
        wherein impurities of a non-conductive type contained in the semiconductor region have an uneven concentration distribution along a depth direction of the semiconductor region.

2. The semiconductor device according to claim 1,
    wherein the impurities of the non-conduct type have a maximum concentration of greater than or equal to twice the minimum concentration along the depth direction of the post-heated semiconductor region.

3. A semiconductor device comprising:
    an anode semiconductor region that includes impurities of a first conductivity type;
    a cathode semiconductor region that includes a high concentration of impurities of a second conductivity type; and
    an intermediate semiconductor region that either includes a small concentration of impurities of the second type or substantially does not include impurities, wherein the intermediate semiconductor region is formed between the anode semiconductor region and the cathode semiconductor region,
    wherein non-conductive impurities having an uneven concentration distribution along the direction that joins the anode semiconductor region and the cathode semiconductor region is included at least in the intermediate region.

4. The semiconductor device according to claim 3,
    wherein a position of the highest concentration of the non-conductive impurities is located in the vicinity of a boundary between the anode semiconductor region and the intermediate semiconductor region.

5. The semiconductor device according to claim 3,
    wherein the non-conductive impurities have a maximum concentration that is greater than or equal to twice the minimum concentration along the direction that joins the anode semiconductor region and the cathode semiconductor region.

6. A semiconductor device comprising:
    a collector electrode;
    a collector semiconductor region that includes impurities of a first conductivity type, wherein the collector semiconductor region is formed above the collector electrode;
    a second conductivity type base semiconductor region that includes impurities of a second conductivity type, wherein the second conductivity type base semiconductor region is formed above the collector semiconductor region;
    a first conductivity type base semiconductor region that includes impurities of the first conductivity type, wherein the first conductivity type base semiconductor region is separated from the collector semiconductor region by the second conductivity type base semiconductor region;
    an emitter semiconductor region that includes impurities of the second conductivity type, wherein the emitter semiconductor region is separated from the second conductivity type base semiconductor region by the first conductivity type base semiconductor region; and
    a gate electrode that faces, via an insulating film, the first conductivity type base semiconductor region that separates the second conductivity type base semiconductor region and the emitter semiconductor region,
    wherein non-conductive impurities having an unequal concentration distribution along the direction that joins the collector semiconductor region and the emitter semiconductor region are included at least in second conductivity type base semiconductor region.

7. The semiconductor device according to claim 6,
    wherein a position of the highest concentration of the non-conductive impurities is located in the vicinity of a boundary between the collector semiconductor region and the second conductivity type base semiconductor region.

8. The semiconductor device according to claim 6, further comprising:
    a buffer semiconductor region that includes a higher concentration of impurities of the second conductivity type than the second conductivity type base semiconductor region,
    wherein the buffer semiconductor region is formed between the collector semiconductor region and the second conductivity type base semiconductor region.

9. The semiconductor device according to claim 8,
    wherein a position of the highest concentration of the non-conductive impurities is located in the vicinity of a boundary between the collector semiconductor region and the buffer semiconductor region.

10. The semiconductor device according to claim 7,
    wherein a plurality of the collector semiconductor regions is intermittently above the collector electrode, and
    the collector electrode and the second conductivity type base semiconductor region are electrically connected via spaces between neighboring collector semiconductor regions.

11. The semiconductor device according to claim 10,
    wherein a position of the highest concentration of the non-conductive impurities is located in the vicinity of a boundary between the collector semiconductor region and the second conductivity type base semiconductor region.

12. The semiconductor device of according to claims 6,
    wherein the non-conductive impurities have a maximum concentration of greater than or equal to twice the minimum concentration along the direction that joins the collector semiconductor region and the emitter semiconductor region.

* * * * *

UNITED STATES PATENT AND TRADEMARK OFFICE
CERTIFICATE OF CORRECTION

PATENT NO. : 7,569,914 B2
APPLICATION NO. : 11/902978
DATED : August 4, 2009
INVENTOR(S) : Shinya Yamazaki, Tomoyoshi Kushida and Takahide Sugiyama It is certified that error appears in the above-identified patent and that said Letters Patent is hereby corrected as shown below:

In claim 2, column 19, line 31, "non-conduct" should read --non-conducive--;

In claim 12, column 20, line 59, "device of according to claims" should read --device according to claim--.

Signed and Sealed this

Twenty-ninth Day of September, 2009

David J. Kappos
*Director of the United States Patent and Trademark Office*